US009807864B1

(12) United States Patent
Lupoli et al.

(10) Patent No.: US 9,807,864 B1
(45) Date of Patent: Oct. 31, 2017

(54) ELECTRODE, ACCELERATOR COLUMN AND ION IMPLANTATION APPARATUS INCLUDING SAME

(71) Applicant: Varian Semiconductor Equipment Associates, Inc., Gloucester, MA (US)

(72) Inventors: Christopher Lupoli, Exeter, NH (US); Sheri A. Durgin, Salem, MA (US); Daniel McGillicuddy, West Peabody, MA (US); Victor J. Theriault, South Hamilton, MA (US); Klaus Becker, Kensington, NH (US)

(73) Assignee: Varian Semiconductor Equipment Associates Inc., Gloucester, MA (US)

( * ) Notice: Subject to any disclaimer, the term of this patent is extended or adjusted under 35 U.S.C. 154(b) by 0 days.

(21) Appl. No.: 15/228,158

(22) Filed: Aug. 4, 2016

(51) Int. Cl.
| | |
|---|---|
| *H01J 37/00* | (2006.01) |
| *H05H 5/00* | (2006.01) |
| *H05H 5/06* | (2006.01) |
| *H01J 37/317* | (2006.01) |

(52) U.S. Cl.
CPC ......... *H05H 5/063* (2013.01); *H01J 37/3171* (2013.01); *H01J 2237/31701* (2013.01)

(58) Field of Classification Search
CPC ........ H01J 37/10; H01J 37/30; H01J 37/3007; H01J 37/3171; H05H 5/00; H05H 15/00
USPC ..... 250/281, 282, 283, 396 R, 396 ML, 398, 250/400, 492.1, 492.2, 492.3
See application file for complete search history.

(56) References Cited

U.S. PATENT DOCUMENTS 3,328,618 A    6/1967  Wilson

*Primary Examiner* — Nicole Ippolito
*Assistant Examiner* — Hanway Chang

(57) ABSTRACT

An electrode for manipulating an ion beam. The electrode may include an insert having an ion beam aperture to conduct the ion beam therethrough, the insert comprising a first electrically conductive material; a frame disposed around the insert and comprising a second electrically conductive material; and an outer portion, the outer portion disposed around the frame and comprising a third electrically conductive material, wherein the insert is reversibly detachable from the frame, and wherein the frame is reversibly attachable from the outer portion.

19 Claims, 3 Drawing Sheets

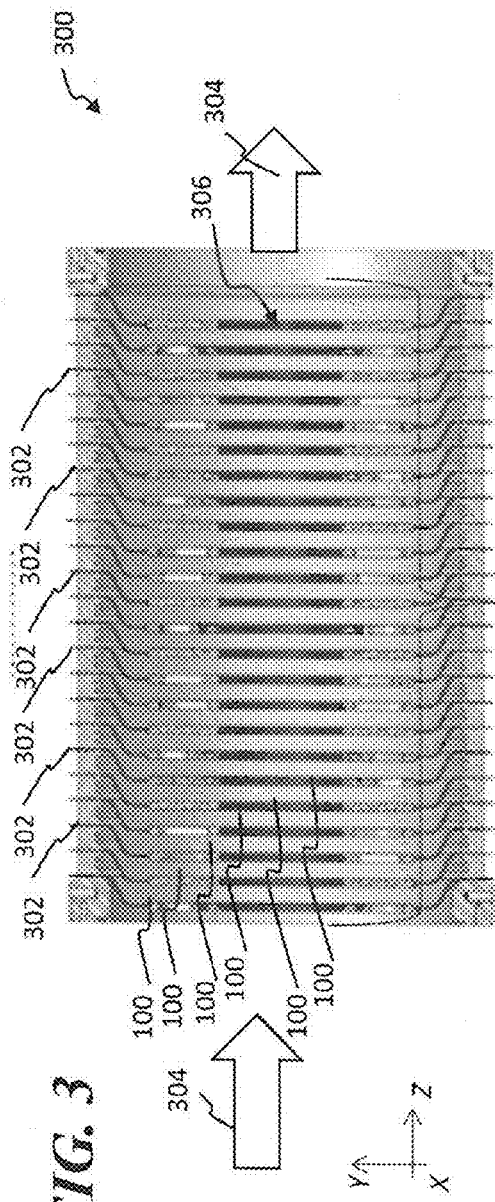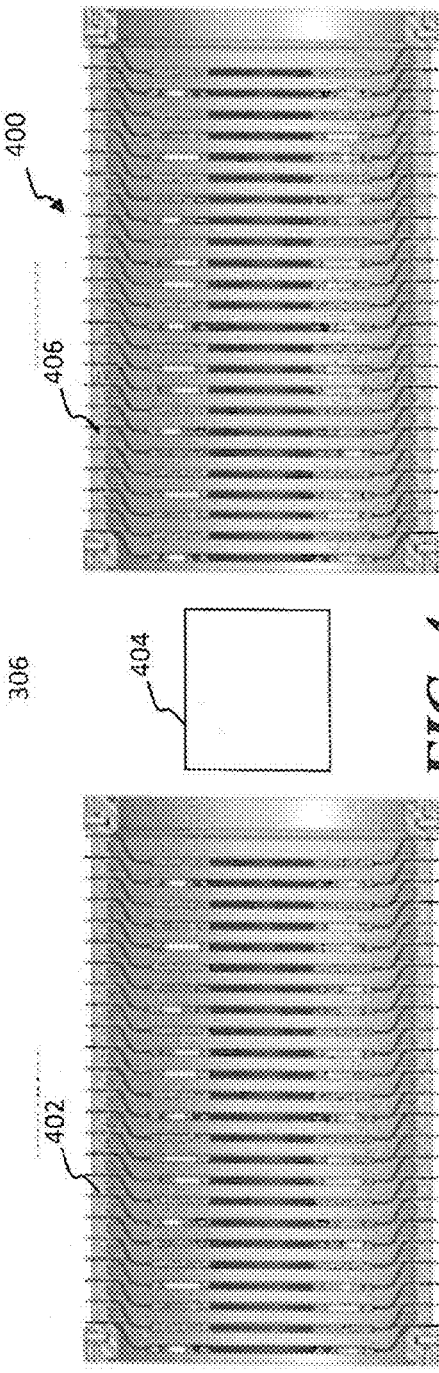
FIG. 3
FIG. 4

ELECTRODE, ACCELERATOR COLUMN AND ION IMPLANTATION APPARATUS INCLUDING SAME

FIELD

The present embodiments relate to beamline ion implanters and more particularly to electrodes in ion implanters for accelerating an ion beam.

BACKGROUND

In the present day, beamline ion implanters employ multiple components to direct an ion beam from an ion source to a substrate. In order to properly treat a substrate, the ion beam may be accelerated to a target ion energy, and may have its trajectory and shape manipulated by various beamline components to produce a set of target characteristics of the ion beam at the substrate. In many types of ion implanters, including medium energy and high energy ion implanters, an acceleration column(s) may be employed to accelerate or decelerate an ion beam in order to generate a target beam energy. A given acceleration column may include many electrodes arranged in electrical series fashion to accelerate an ion beam. For example, an acceleration column may include multiple electrodes having apertures to conduct the ion beam and arranged to increase a beam energy by applying a series of different potentials to the different electrodes. In this manner, the ion beam is accelerated according to the different potentials applied to the electrodes. In some examples, the potential applied to different electrodes may be increased from a first electrode in an acceleration column to a last electrode in an acceleration column, where the ion beam enters the acceleration column having a relatively lower energy and exits having a relatively higher energy.

Because in beamline ion implanters often just a target ion species, such as a dopant species, is to be implanted into a substrate, ensuring the ion beam has minimal contact with components used to manipulate the ion beam between ion source and substrate may be useful. In the case of electrodes used in an acceleration column, at least some ions in the ion beam may inadvertently strike an electrode, causing sputtering of material from the electrode. This sputtering may result in contaminant species from the electrode being generated where the contaminant species may be ionized and conducted to the substrate in addition to the target species. Known electrodes in acceleration columns, for example, may be constructed using titanium or other electrically conductive material. Titanium provides a machinable and relatively refractory metal (melting point 1668° C.), has a low coefficient of thermal expansion, making titanium generally suitable for an electrode. When an ion beam is conducted through an acceleration column containing titanium electrodes, titanium may be inadvertently sputtered by the ion beam, resulting in titanium contamination in a substrate, such as a silicon wafer. This contamination may be problematic for performance of a semiconductor device being fabricated from the substrate. While constructing an electrode in an accelerator column from another material may be possible, less damaging to semiconductor properties, other materials may have less desirable properties, such as higher thermal coefficient of expansion, or lower elastic modulus.

With respect to these and other considerations the present disclosure is provided.

BRIEF SUMMARY

In one embodiment, an electrode for manipulating an ion beam may include an insert having an ion beam aperture to conduct the ion beam therethrough, the insert comprising a first electrically conductive material; a frame disposed around the insert and comprising a second electrically conductive material; and an outer portion, the outer portion disposed around the frame and comprising a third electrically conductive material, wherein the insert is reversibly attachable from the frame, and wherein the frame is reversibly detachable from the outer portion.

In another embodiment, an accelerator column to accelerate an ion beam, may include an electrode assembly, comprising a first plurality of electrodes, the first plurality of electrodes being electrically isolated from one another; wherein a given electrode of the electrode assembly comprises: an insert having an in beam aperture to conduct the ion beam therethrough; a frame disposed around the insert; and an outer portion, the outer portion disposed around the frame, wherein the insert is reversibly attachable from the frame, wherein the frame is reversibly detachable from the outer portion, and wherein the insert, the frame, and the outer portion are electrically conductive.

In a further embodiment, an ion implanter may include an ion source to generate an ion beam; and an accelerator column to accelerate the ion beam, the accelerator disposed downstream of the ion source and comprising: a first electrode assembly, comprising a first plurality of electrodes, wherein the first plurality of electrodes are electrically isolated from one another; and wherein a given electrode of the first electrode assembly comprises: an insert having an ion beam aperture to conduct the ion beam therethrough; a frame disposed around the insert; and an outer portion, the outer portion disposed around the frame, wherein the insert is reversibly detachable from the frame, wherein the frame is reversibly attachable from the outer portion, and wherein the insert, the frame, and the outer portion are electrically conductive.

BRIEF DESCRIPTION OF THE DRAWINGS

FIG. 3 illustrates an exemplary accelerator column incorporating a set of electrodes arranged according to embodiments of the disclosure;

FIG. 4 depicts an exemplary tandem accelerator incorporating electrodes arranged according to embodiments of the disclosure;

Figure 1:
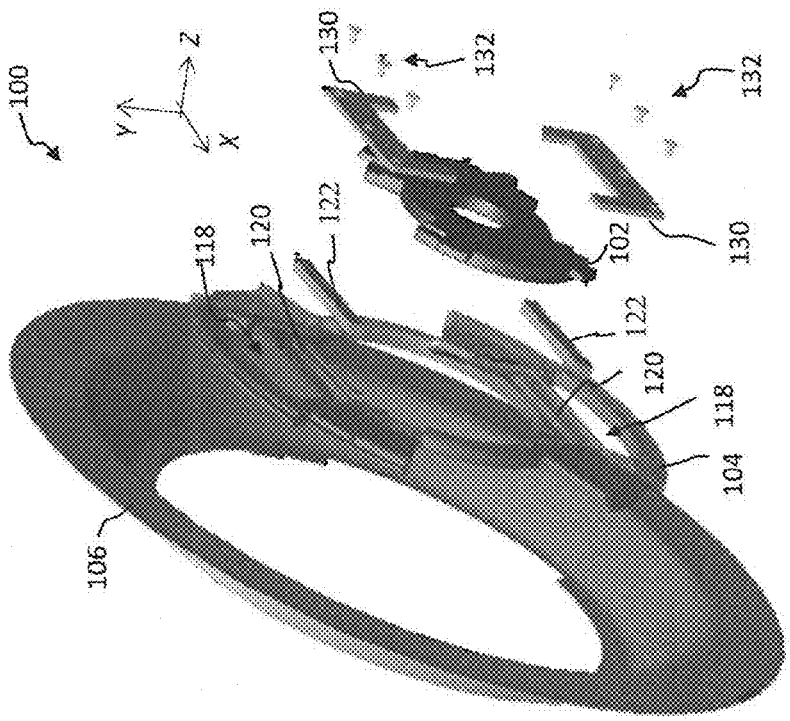
FIG. 1 illustrates an end view of an electrode according to embodiments of the disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

Figure 2:
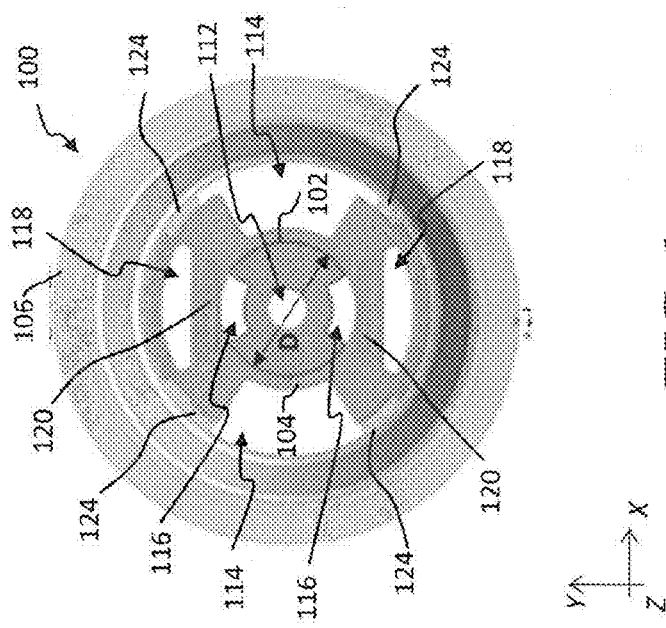
FIG. 2 illustrates an exploded perspective view of an electrode according to further embodiments of the disclosure.

The present embodiments are related to ion beam processing apparatus such as beamline implanters. Various embodiments provide novel and improved electrodes for manipulating an ion beam, including novel accelerator columns in a beamline ion implanter. The present embodiments may be useful in beamline ion implanters where ion energy may range above 50 keV, and up to energies of 10 MeV, for example. The embodiments are not limited in this context. FIG. 1 illustrates an end view of an electrode according to embodiments of the disclosure, while FIG. 2 illustrates an exploded perspective view of an electrode according to further embodiments of the disclosure. FIG. 3 illustrates an exemplary accelerator column incorporating a set of electrodes arranged according to embodiments of the disclosure, while FIG. 4 depicts an exemplary tandem accelerator incorporating electrodes arranged according to embodiments of the disclosure.

Figure 5:
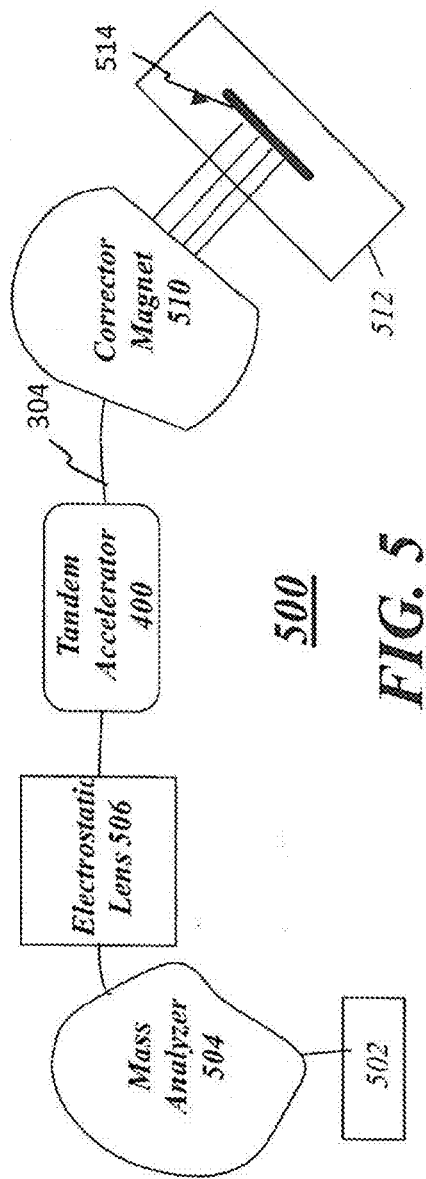
FIG. 5 depicts an exemplary ion implantation apparatus according to various embodiments of the disclosure.

FIG. 5 depicts an exemplary ion implantation apparatus according to various embodiments of the disclosure. Referring briefly to FIG. 5, there is shown an ion implanter 500, arranged as a beamline ion implanter. The ion implanter 500 in different embodiments may be a medium energy ion implanter, designed to operate over voltage ranges of 50 kV to 500 kV, or may be a high energy ion implanter, designed to operate over voltage ranges of 300 kV to 10 MeV. The embodiments are not limited in this context. The ion implanter 500 may include known components such as an ion source 502, mass analyzer 504, electrostatic lens 506, corrector magnet 510, and substrate stage 512, housing a substrate 514. The ion implanter 500 may include additional components or fewer components as will be appreciated by those of skill in the art. The ion implanter 500 may include an accelerator column, or a plurality of acceleration columns in different embodiments, where the accelerator column includes at least one novel electrode arranged according to the present embodiments. The ion implanter 500 in this embodiment shown in FIG. 5 includes a tandem accelerator 400, where details of the tandem accelerator 400 are discussed with respect to FIG. 4.

Turning now to FIG. 1, there are shown details of an electrode 100 according to embodiments of the disclosure. The electrode 100 may be used for manipulating an ion beam in a beamline ion implanter. In particular, the electrode 100 may be used in an accelerator column having a plurality of electrodes arranged to accelerate an ion beam to a target potential (voltage). The electrode 100 may include an insert 102, a frame 104 disposed around the insert 102, and an outer portion 106, disposed around the frame 104. According to various embodiments, the insert 102 may be reversibly attachable from the frame 104, and the frame 104 may be reversibly attachable from the outer portion 106. The term "reversibly attachable" as used herein means a component designed to be attached and detached from another component in a reversible manner. In various embodiments, the insert may be made of a first electrically conductive material, the frame 104 may be made of a second electrically conductive material; and the outer portion 106 may be made of a third electrically conductive material. In various embodiments, the first material of the insert 102 may differ from the second material of the frame 104, while the second material of the frame 104 may differ from the third material of the outer portion 106 as well as from the material of the insert 102. In some embodiments, the material of the frame 104, insert 102 and outer portion 106 may be the same material. In other embodiments, the material of two of the components may be the same material, such as insert 102 and frame 104, while the material of the third component, such as the outer portion 106 is a different material from the frame material and insert material. The embodiments are not limited in this context. In various embodiments, the material of the insert 102, as well as the material of the frame 104, and material of the outer portion 106 may be varied according to a target application. The electrode 100 accordingly provides a modular structure where the electrode 100 may include different combinations of materials for the different components, where the materials are tailored to a given application.

In various embodiments, the outer portion 106 may be made of titanium or a titanium alloy similar to known electrodes where the electrode may be composed of a unitary piece of titanium. By providing a modular insert and frame in locations proximate to where the ion beam is conducted, the electrode 100 allows materials for the insert 102, in particular, to be chosen to avoid or lower contamination during an implantation process. In various embodiments, for example, the material of the insert 102 and the material of the frame 104 may be made of materials other than titanium. This may prevent sputtering of titanium material by an ion beam conducted through the electrode 100 in an ion implanter, where the titanium may represent a contaminant in an implantation process being performed by the electrode 100.

As further depicted in FIG. 1, the insert 102 may include an ion beam aperture 112 to conduct an ion beam through the aperture, for example, along the Z-axis of the Cartesian coordinate system shown. In exemplary embodiments, the insert 102 may comprise an outer diameter of 2.5 inches to 4 inches, while the ion beam aperture 112 comprises a diameter of 1 inch to 3.2 inches. These dimensions are merely exemplary, and the embodiments are not limited in this context.

As an example, the insert 102 may comprise graphite, aluminum, tungsten, molybdenum or tantalum, in different embodiments. The embodiments are not limited in this context. These materials may be useful in context of ion implantation to avoid material contamination in a substrate caused by the use of conventional electrodes composed of titanium, as well as to avoid radiation caused by high energy ions when impacting certain materials. For example, in embodiments where electrode 100 is used to generate a proton beam, protons may tend to generate gamma radiation when impacting certain materials at energies in the MeV range. As an example, $^{49}$Ti, occurring naturally as an isotope of about 5% in titanium, creates neutrons when impacted with proton energy above 1.5 MeV. As another example, 12C when impacted by high energy protons above 70 keV, creates gamma radiation, where peaks in gamma radiation generation occur at 420 keV and 5 MeV. Those of ordinary skill may appreciate the composition of the insert may be chosen according to the ion implantation application in accordance with ion energy to be generated in order to avoid generation of unwanted radiation.

As noted, in various embodiments, the frame 104 may comprise a different material than the material of the insert 102. For example, the material of insert 102 may be chosen so as to limit material contamination of a substrate and may be additionally designed to limit the generation of high energy electromagnetic radiation such as gamma rays, while the material of frame 104 may be chosen according to other considerations. In accordance with known ion implanters, the ion beam aperture 112 may be sized to accommodate ion beams so the nominal diameter of the ion beam being conducted through the ion beam aperture 112 is smaller than the diameter of the ion beam aperture 112. Accordingly, when the ion beam is centered within the ion beam aperture 112, most material from electrode 100 inadvertently sputtered by an ion beam, may generally be material from insert 102, since insert 102 is disposed closest to the ion beam. In one example, for purposes of illustration, the outer diameter of the insert 102 may be 4 inches while the maximum inner diameter of the ion beam aperture 112 may be 2.5 inches. Under the assumption the nominal beam diameter of an ion beam passing through the ion beam aperture 112 is less than 2.5 inches, the ion beam may be less likely to strike any material from the frame 104, since the inner diameter of the frame 104 is the same as the outer diameter of the ion beam aperture 112 (4 inches). Accordingly, the frame 104 may be chosen from a group of materials where contamination by sputtering from an ion beam is not a paramount consideration. In some embodiments for example, the frame 104 may comprise a high thermal conductivity material. A high thermal conductivity material may have a thermal conductivity of 50 W/m-K or greater. For example, aluminum may be used as the frame 104 where aluminum may have a (room temperature) thermal conductivity of approximately 200 W/m-K, as opposed to titanium, where the thermal conductivity is in the range of 20 W/m-K. In other embodiments, other materials different than aluminum may be chosen as the material for frame 104. By providing a highly thermally conductive material for frame 104, heat generated in an electrode or series of electrodes in an accelerator column may be more effectively dissipated, especially in circumstances where the accelerator column generates temperature ranges where thermal conductivity plays a large role in heat transport. In some embodiments, the material for an insert, as well material for a frame may be chosen according to the ability of the insert or frame to dissipate heat by radiation. For example, accelerator columns may be operated under conditions where temperature of electrode components may reach up to 2800 K. Under such elevated temperatures, primary heat transport may take place via radiation. As an example, graphite may radiate heat at a rate of 35 W/cm$^2$ at 2800 K, providing a convenient insert material and frame material to dissipate heat from an electrode, of particular importance under conditions where an insert resides in high vacuum, and has just small regions of contact with other portions of an electrode, where the small regions of contact provide locations where heat conduction may take place.

In various additional embodiments, the choice of material for an insert or frame may be guided by additional considerations. While graphite may be useful for many applications due to generally good machinability and low contamination of semiconductor materials, there are restrictions for shaping graphite, for example in very thin sheets, and in processes relying on deformation, such as assembly by press fitting. Aluminum may be useful because of low cost, low weight and easy workability. Restrictions for use of aluminum include the avoidance of substrate contamination, where coating of aluminum by graphite of silicon may address this issue. Secondly, aluminum and its alloys also have a low maximum working temperature of about 300° C. or less. Tantalum or Tungsten may be used as insert or frame materials for high temperature applications requiring corrosion resistance. A drawback of tungsten and tantalum is their high weight and low workability. Accordingly, the choice of insert and frame material may be performed based upon a balance of considerations as discussed above.

As further shown in FIG. 1, the insert 102 may be designed so as to define inner apertures 116 between the insert 102 and frame 104. The frame 104 may further include frame apertures 118 as shown, and may be further designed so as to define outer apertures 114 in conjunction with the outer portion 106. These apertures may be used, for example to conduct gas through an electrode and accelerator column generally as in known ion implanters.

Turning now to FIG. 2, there is shown an embodiment of the electrode 100 where the electrode 100 includes a cover portion 130, in this case arranged in two pieces as shown. The cover portion 130 when assembled may be disposed at least partially over the insert 102 so as to affix the insert 102 to the frame 104. The cover portion 130 may be affixed to the frame 104 using reversible fasteners 132, such as screws. In this manner, the cover portion 130 may also hold the insert 102 in place against the frame 104. The embodiments are not limited in this context as other known fastening mechanisms may be used to affix the insert 102 to the frame 104 in a reversibly detachable manner. Accordingly, when useful, the insert 102 may be separately removed from the frame 104, such as for cleaning or when a different insert is to be used in the electrode 100, such as a different material for insert 102 or a replacement for insert 102 where the material is the same.

As further shown in FIG. 2, the frame 104 may include a recess portion 120, in this example being arranged in two different regions of the frame 104. The recess portion 120 may be arranged to accommodate a magnet assembly 122, where the magnet assembly 122 may include two magnets as shown. These magnets may be used as in known electrodes of acceleration columns for controlling charged particles. In this context the cover portion 130 may be a non-magnetic material and may also hold the magnet assembly 122 in place in the recess portion 120.

As further shown in FIG. 1, the outer portion 106 may include coupling portions 124, where the coupling portions 124 are designed to engage outer regions of the frame 104 as shown. The coupling portions 124 may be tabs, recesses, or similar features or combinations of features arranged to reversibly attach and detach the frame 104 from outer portion 106. In some examples, the frame 104 may be rotatably attachable to the outer portion 106 as in known designs. Accordingly, when useful, the frame 104 may be separately removed from the outer portion 106, such as for cleaning or when a different frame is to be used in the electrode 100, such as a different material for frame 104 or a replacement for frame 104 where the material is the same, or when a different component for outer portion 106 is to be used.

Turning now to FIG. 3, there is shown an accelerator column 300 according to embodiments of the disclosure. The accelerator column 300 may include an electrode assembly containing a plurality of electrodes, shown as electrodes 100, as generally described above. The accelerator column 300 may include insulators 302, where the insulators 302 are disposed between adjacent electrodes, so the electrodes 100 are electrically isolated from one another as in known accelerator columns. The accelerator column 300 may be arranged to conduct an ion beam 304 through the accelerator column as shown, where the different electrodes of electrodes 100 define a column aperture 306 extending through the accelerator column 300. To obtain a target ion energy for an ion beam 304, different voltages may be applied to the different electrodes, such as a monotonically increasing (in absolute magnitude) voltage between the different electrodes. As an example, where the accelerator column 300 includes 25 electrodes, a voltage of 40 kV may be applied to a first, entrance electrode at the left of the accelerator column 300, while increasing voltage may be applied to successive electrodes to the right of the first electrode. In some embodiments, the voltage may be increased uniformly between successive electrodes, such as an increase of 40 kV between adjacent electrodes, wherein an assembly of 25 electrodes generates a voltage change of 1 MeV. The embodiments are not limited in this context. In accordance with various embodiments of the disclosure, at least one of the electrodes, shown as electrodes 100, may be arranged as shown in FIG. 1 and FIG. 2 so as to include an insert 102, where the insert 102 may be made from a material chosen to reduce material or radiation contamination as described above. The accelerator column 300 may be arranged to have the same general size and shape as known accelerator columns, so the novel electrodes of the present embodiments may be accommodated within known ion implanter configurations.

In some embodiments, an accelerator column such as accelerator column 300 may be arranged in a tandem accelerator including two different accelerator columns. Turning now to FIG. 4, there is shown a side view of a tandem accelerator 400 according to embodiments of the disclosure. As shown in FIG. 4, the tandem accelerator 400 includes a first accelerator column 402, a charge exchange chamber 404, disposed adjacent the first accelerator column 402, and a second accelerator column 406, disposed adjacent the charge exchange chamber 404, and disposed downstream of the first accelerator column 402.

As in known tandem accelerators, the tandem accelerator 400 may be employed to accelerate ions in an ion beam to high energy such as energies greater than 3000 keV. The embodiments are not limited in this context. In a tandem accelerator, a first ion species may be accelerated to a target energy in a first accelerator column, followed by a charge exchange process where the ion species may change from a positive ion to a negative ion, for example. In another example, a first ions species may be a negative ion to be changed to a positive ion in a charge exchange process. The new ion species may be accelerated through a second accelerator column to further increase the ion energy. As in known tandem accelerators, the second accelerator column may have the voltages applied to individual electrodes reversed in sequence as compared to the first accelerator column, since the charge on the new ion species may be opposite the charge of the first species. For example, a first accelerator column may accelerate a singly charged negative ion to an ion energy of 1 MeV, while a second accelerator column accelerates a singly positively charged ion, having an initial energy of 1 MeV, to an energy of 2 MeV. A maximum voltage may exist at electrodes adjacent the charge in exchange chamber in the first accelerator column and second accelerator column.

In some embodiments, the first accelerator column 402 of tandem accelerator 400 may be configured with a plurality of electrodes where most or all of the different electrodes have the same structure as one another, such as the structure of the electrodes 100 discussed above. The same may apply to the second accelerator column 406 where the electrodes may also be arranged as electrodes 100 discussed above. In some embodiments, an accelerator column may comprise a variable ion beam aperture size where a first ion beam aperture of a first electrode of the accelerator column has a first diameter, and where a second ion beam aperture of a second electrode of the accelerator column has a second diameter, where the second diameter is different than the first diameter. A series of electrodes may be arranged so the aperture size of an insert 102 varies monotonically from one electrode to a next electrode, so as to define a conical shaped ion beam aperture, for example.

In some embodiments of the disclosure, an accelerator column may include a first electrode assembly, and an additional electrode assembly, or second electrode assembly, where the second electrode assembly is disposed adjacent the first electrode assembly and is different in structure or materials from the first electrode assembly. For example, a first electrode assembly of an accelerator column may include a plurality of electrodes generally constructed as described for electrodes 100, including an insert 102, frame 104 and outer portion 106. In particular variants, the plurality of electrodes in the first electrode assembly may have the same ion beam aperture size, while in other variants the plurality of electrodes of the first electrode assembly may define a varying ion beam aperture size between different electrodes. In various embodiments of the disclosure, the second electrode assembly may be constructed as a unitary structure from an electrically conductive material, where the second electrode assembly comprises at least one additional electrode. The second electrode assembly may, for example, be constructed from a plurality of titanium electrodes having a known structure. By unitary structure, an electrode generally constitutes one piece, where the one piece is not generally disassembled or able to be disassembled, even if originally formed from more than one piece. The unitary structure may further be formed from a single material. For example, known titanium electrodes may be formed of just titanium and may generally not be disassembled. By providing an accelerator column having two different electrode assemblies, an accelerator column may include electrodes arranged according to the present embodiments in target portions of the accelerator column, while including electrodes of known structure in other portions of the accelerator column. This two-assembly configuration may be useful for aiding in cost considerations, in maintenance, ease of assembly, concentricity, or other considerations.

Figure 6:
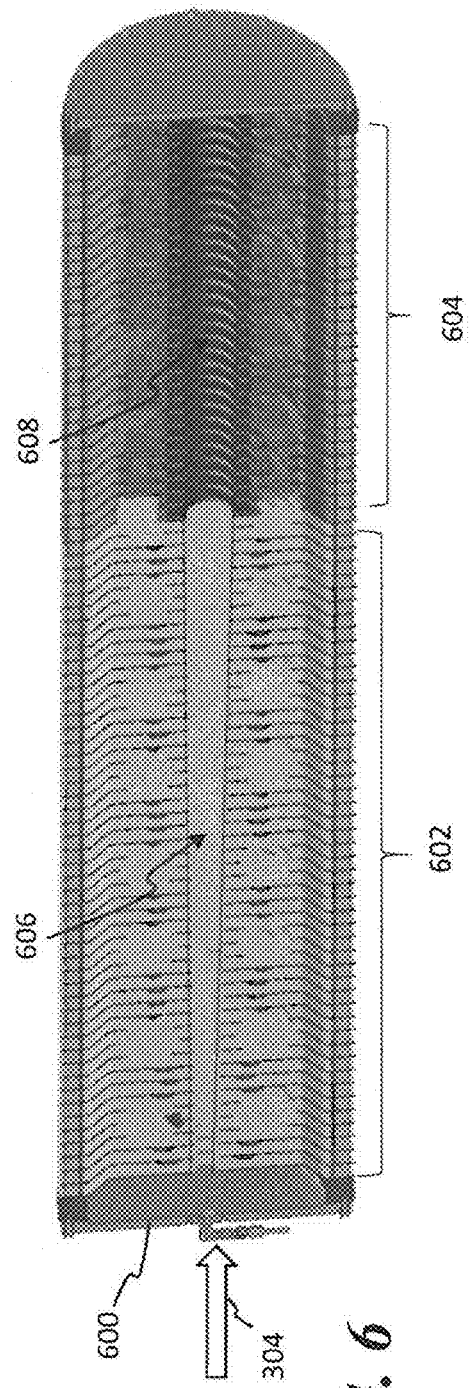
FIG. 6 shows a side view of an accelerator column according to further embodiments of the disclosure.

Turning now to FIG. 6 there is shown a side view of an accelerator column 600 according to further embodiments of the disclosure. In this embodiment, the accelerator column 600 includes a first electrode assembly 602 and a second electrode assembly 604, disposed adjacent the first electrode assembly 602. The accelerator column 600 may form part of a tandem accelerator in some embodiments. In particular embodiments, the accelerator column 600 may form a downstream accelerator column in a tandem accelerator where the ion beam 304 enters from the right as shown, after a charge exchange process. In various embodiments the first electrode assembly may include electrodes having the same general structure as electrodes 100, while the ion beam aperture size may vary between electrodes so as to define a variable size ion beam aperture, shown as ion beam aperture 606, as in known accelerator columns. In this example, the aperture size of the ion beam aperture 606 may increase from left to right within the first electrode assembly 602. The second electrode assembly 604 may be formed using known electrodes, such as titanium electrodes in some examples. As suggested by FIG. 6, the ion beam aperture size of the ion beam aperture 608 in the second electrode assembly 604 may be constant.

In some embodiments, a similarly configured, while mirror imaged, accelerator column may form an upstream accelerator column in a tandem accelerator. In additional embodiments, an upstream accelerator column of a tandem accelerator may be configured differently from the accelerator column 600.

There are multiple advantages provided by the present embodiments, including the ability to reduce the contamination in medium energy and high energy ion implanters without redesign of the accelerator columns. Additionally, the present embodiments provide flexibility in ion implantation processing by providing a modular electrode design where just a center portion (insert) may be selectively replaced when appropriate.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, the present disclosure has been described herein in the context of a particular implementation in a particular environment for a particular purpose, while those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. An electrode for manipulating an ion beam, comprising:
   an insert having an ion beam aperture to conduct the ion beam therethrough, the insert comprising a first electrically conductive material;
   a frame disposed around the insert and comprising a second electrically conductive material; and
   an outer portion, the outer portion disposed around the frame and comprising a third electrically conductive material,
   wherein the insert is reversibly attachable from the frame, and wherein the frame is reversibly detachable from the outer portion.

2. The electrode of claim 1, wherein the first electrically conductive material is different from the electrically conductive second material, and wherein the second electrically conductive material is different from the third electrically conductive material.

3. The electrode of claim 2, wherein the insert comprises graphite or tantalum.

4. The electrode of claim 2, wherein the frame comprises a high thermal conductivity material.

5. The electrode of claim 2, wherein the frame comprises aluminum.

6. The electrode of claim 1, wherein the outer portion comprises titanium and the insert does not comprise titanium.

7. The electrode of claim 1, further comprising a magnet assembly, wherein the frame comprises a recess portion to accommodate the magnet assembly.

8. The electrode of claim 1, further comprising a cover portion, the cover portion being non-magnetic, wherein the cover portion is disposed at least partially over the insert, is detachable from the insert, and is arranged to affix the insert to the frame.

9. The electrode of claim 1, wherein the frame is rotatably attachable and detachable form the outer portion.

10. The electrode of claim 1, wherein the insert comprises an outer diameter of 2.5 inches to 4 inches, and wherein the ion beam aperture comprises a diameter of 1 inch to 3.2 inches.

11. An accelerator column to accelerate an ion beam, comprising:
    an electrode assembly, comprising a first plurality of electrodes, the first plurality of electrodes being electrically isolated from one another;
    wherein a given electrode of the electrode assembly comprises:
      an insert having an in beam aperture to conduct the ion beam therethrough;
      a frame disposed around the insert; and
      an outer portion, the outer portion disposed around the frame,
      wherein the insert is reversibly attachable from the frame, wherein the frame is reversibly detachable from the outer portion, and wherein the insert, the frame, and the outer portion are electrically conductive.

12. The accelerator column of claim 11, wherein the insert comprises a first material, the frame comprises a second material, and the outer portion comprises a third material, wherein the first material is different from the second material, and wherein the second material is different from the third material.

13. The electrode of claim 11, wherein the outer portion comprises titanium and the insert does not comprise titanium.

14. The accelerator column of claim 11, wherein the accelerator column comprises a variable ion beam aperture size, wherein a first ion beam aperture of a first electrode of the first plurality of electrodes has a first diameter, wherein a second ion beam aperture of a second electrode of the first plurality of electrodes has a second diameter, the second diameter being different than the first diameter.

15. The accelerator column of claim 11, wherein the electrode assembly comprises a first electrode assembly, the accelerator column further comprising a second electrode assembly, the second electrode assembly being disposed adjacent the first electrode assembly, the second electrode assembly comprising at least one additional electrode, the at least one additional electrode comprising an electrically conductive material having a unitary structure.

16. The accelerator column of claim 15, the unitary structure comprising titanium.

17. An ion implanter, comprising:
    an ion source to generate an ion beam; and
    an accelerator column to accelerate the ion beam, the accelerator column disposed downstream of the ion source and comprising:

a first electrode assembly, comprising a first plurality of electrodes, wherein the first plurality of electrodes are electrically isolated from one another; and wherein a given electrode of the first electrode assembly comprises:

an insert having an ion beam aperture to conduct the ion beam therethrough;

a frame disposed around the insert; and an outer portion, the outer portion disposed around the frame, wherein the insert is reversibly detachable from the frame, wherein the frame is reversibly attachable from the outer portion, and wherein the insert, the frame, and the outer portion are electrically conductive.

18. The ion implanter of claim 17, wherein the accelerator column comprises a first accelerator column, the ion implanter further comprising:

a charge exchange chamber disposed adjacent the first accelerator column; and a second accelerator column disposed adjacent the charge exchange chamber and downstream of the first accelerator column, the second accelerator column comprising:

an additional electrode assembly, comprising a second plurality of electrodes, wherein the second plurality of electrodes are electrically isolated from one another; and wherein a given electrode of the additional electrode assembly comprises:

an insert having an ion beam aperture to conduct the ion beam therethrough;

a frame disposed around the insert; and an outer portion, the outer portion disposed around the frame, wherein the insert is reversibly detachable from the frame, wherein the frame is reversibly detachable from the outer portion, and wherein the insert, the frame, and the outer portion are electrically conductive.

19. The ion implanter of claim 18, wherein at least the first accelerator column comprises:

a second electrode assembly, the second electrode assembly being disposed adjacent the first electrode assembly, the second electrode assembly comprising at least one additional electrode, the at least one additional electrode comprising an electrically conductive material having a unitary structure.

\* \* \* \* \*